United States Patent [19]
Davidson et al.

[11] Patent Number: 5,894,711
[45] Date of Patent: Apr. 20, 1999

[54] BOX HANDLING APPARATUS AND METHOD

[75] Inventors: James P. Davidson, Aptos; Andrew Paul Lunday, San Mateo; Gordon P. Hampton, Cupertino, all of Calif.; James C. Lenk, O'Fallon, Mo.; Gary L. Anderson, St. Ann, Mo.; Larry W. Shive, St. Peters, Mo.

[73] Assignee: MEMC Electronic Materials, Inc., St. Peter, Mo.; part interest

[21] Appl. No.: 08/891,529

[22] Filed: Jul. 11, 1997

[51] Int. Cl.$^6$ .............. B65B 69/00; B65B 23/00; B65B 7/28; B65B 31/02
[52] U.S. Cl. .............. 53/432; 53/458; 53/468; 53/471; 53/486; 53/487; 53/492; 53/281; 53/289; 53/290; 53/381.4; 53/510
[58] Field of Search .............. 53/468, 432, 433, 53/471, 486, 492, 281, 289, 290, 376.3, 381.4, 458, 510, 487

[56] References Cited

U.S. PATENT DOCUMENTS

| | | | |
|---|---|---|---|
| 3,261,144 | 7/1966 | Weber | 53/488 |
| 3,545,163 | 12/1970 | Mahaffy et al. | 53/488 |
| 3,561,190 | 2/1971 | Derenthal | 53/136.4 |
| 3,704,568 | 12/1972 | Duhring et al. | 53/381.4 X |
| 3,894,379 | 7/1975 | Naggert | 53/488 |
| 4,091,919 | 5/1978 | MacLeod et al. | 206/213.1 |
| 4,129,211 | 12/1978 | Clement et al. | 206/213.1 |
| 4,170,861 | 10/1979 | Snyder et al. | 53/468 |
| 4,171,740 | 10/1979 | Clement et al. | 206/213.1 |
| 4,461,136 | 7/1984 | Hudson et al. | 53/211 |
| 4,592,189 | 6/1986 | Martini | 53/136.4 |
| 5,077,956 | 1/1992 | Thimon | 53/399 |
| 5,129,211 | 7/1992 | Anderson | 53/399 |
| 5,184,996 | 2/1993 | Rode et al. | 53/136.4 |
| 5,351,415 | 10/1994 | Brooks et al. | 34/389 |
| 5,369,939 | 12/1994 | Moen et al. | 53/488 |
| 5,419,096 | 5/1995 | Gorlich | 53/432 |
| 5,473,860 | 12/1995 | Linner | 53/432 |
| 5,534,282 | 7/1996 | Garwood | 53/488 |
| 5,551,210 | 9/1996 | Williamson | 53/381.4 X |
| 5,657,617 | 8/1997 | Allen et al. | 53/381.4 X |
| 5,701,722 | 12/1997 | Franklin et al. | 53/399 |

*Primary Examiner*—Horace M. Culver
*Attorney, Agent, or Firm*—Senniger, Powers, Leavitt & Roedel

[57] ABSTRACT

A box handling apparatus having particular application in the packaging of semiconductor wafers, includes a box opening assembly which can unlatch a lid from a bottom of the box and separate the lid from the bottom. Arms can grip an article, such as a wafer cassette, in the bottom of the box and lift it out. The cassette can be loaded, or wafers already in the cassette unloaded. The apparatus can replace the loaded cassette in the bottom of the box and latchingly re-engage the lid.

13 Claims, 11 Drawing Sheets

BOX HANDLING APPARATUS AND METHOD

BACKGROUND OF THE DISCLOSURE

This invention relates generally to box handling apparatus, and more particularly to box handling apparatus for semiconductor wafer packaging.

The final stages of semiconductor wafer production are conventionally carried out in a clean room so that the finished wafers are free from particulate matter deposits and moisture. The condition of the wafers must be maintained as they are transported to a facility in another city or country. Moreover, the wafers must not be physically damaged either by the packaging process or by the rigors of their transportation.

Accordingly, specialized transportation boxes have been developed for transportation of the semiconductor wafers. Typically, these boxes contain a cassette which holds multiple wafers with minimal contact of the front and rear surfaces of the wafer. The cassette is formed with integral dividers defining slots, each of which receive a wafer. The wafers may be loaded into the cassette slots manually, or automatically by presently available machinery. The loaded cassettes are manually placed in a bottom of the box. A lid of the box is placed on the bottom over the cassette and pressed down against the bottom. The box is designed for a snap-latching interengagement of the lid with the bottom. To insure that the lid and bottom are sealed together, tape may be applied around the circumference of the box over the joint between the lid and bottom. The box is then sealed inside a flexible, moisture barrier package (e.g., an aluminum coated acrylar polymer material).

Conventionally, a technician manually opens the box, places the cassette into the box and then manually closes the box. In practice several boxes would be opened at one time so that cassettes could be loaded substantially continuously. The chance of contamination of the wafers in the cassette from particulates and/or moisture is greatly increased when the cassette is handled manually. Moreover, as the box lays open for a period of time there is also an increased opportunity for particulates and moisture to enter the box. Particulates on the interior of the box can readily become deposited on the wafers after the box is closed.

To close the box after the loaded cassette is placed in the bottom portion, a technician presses down on the lid of the box. It is difficult for the technician to apply equal pressure around the box in order to make sure that the lid and bottom portion are latched together. Moreover, failure to apply equal pressure on the lid can cause the wafers in the cassette become "cross slotted". The box is designed so that wafers held in the slots of the cassette are received in aligned slots of the lid. Cross slotting occurs when a wafer held in one slot of the cassette enters a non-aligned slot in the lid when the box is closed. Cross slotting can damage the wafer and generate particulate matter which may become deposited on other wafers in the box.

Thus, there is presently a need for apparatus and a method to handle boxes which is particularly useful in the packaging of semiconductor wafers to protect the wafers from damage and contamination by moisture or particulates.

SUMMARY OF THE INVENTION

Among the several objects and features of the present invention may be noted the provision of box handling apparatus and method which automatically loads and unloads the box; the provision of such apparatus and method which minimizes manual handling of the box and items to be loaded or unloaded from the box; the provision of such apparatus and method which handles items to be placed in or removed from the box so as not to damage or contaminate the items; the provision of such apparatus and method which handles boxes uniformly; the provision of such apparatus and method which minimizes exposure of the interior of the box to the outside environment; the provision of such apparatus and method which purges the interior of the box when opened; and the provision of such apparatus which is easy to use.

A box handling apparatus of the present invention handles a box having a bottom portion and a lid, where the bottom portion and lid are capable of releasable, snap-latching interconnection. Generally, the apparatus comprises a support for holding the box in position for opening the box lid from the bottom portion of the box, and means for automatically unlatching the lid from the bottom portion. Means for automatically obtaining relative movement between the box and the lid causes the lid to least partially separate from the box for providing access to the interior of the box for loading and unloading an article from the box. The moving means is also capable of closing separation of the lid and bottom. Means automatically latches the lid to the bottom of the box for closing the box.

Another aspect of the present invention is a method of handling a box in an apparatus for loading and unloading an article from the box. The box has a lid and a bottom portion constructed for snap-latching interengagement. Generally, the method comprises placing the box on a support of the apparatus with the lid latchingly interengaged with the bottom portion of the box. The box is moved into a box opening assembly which is activated to unlatch the lid from the bottom portion of the box. By obtaining relative motion between the box opening assembly and the bottom portion of the box, the lid is separated at least partially from the bottom portion. Article handling members are activated to engage the article and then to move the engaged article from one of a location inside the bottom portion of the box and a location outside of the box to the other of the locations.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
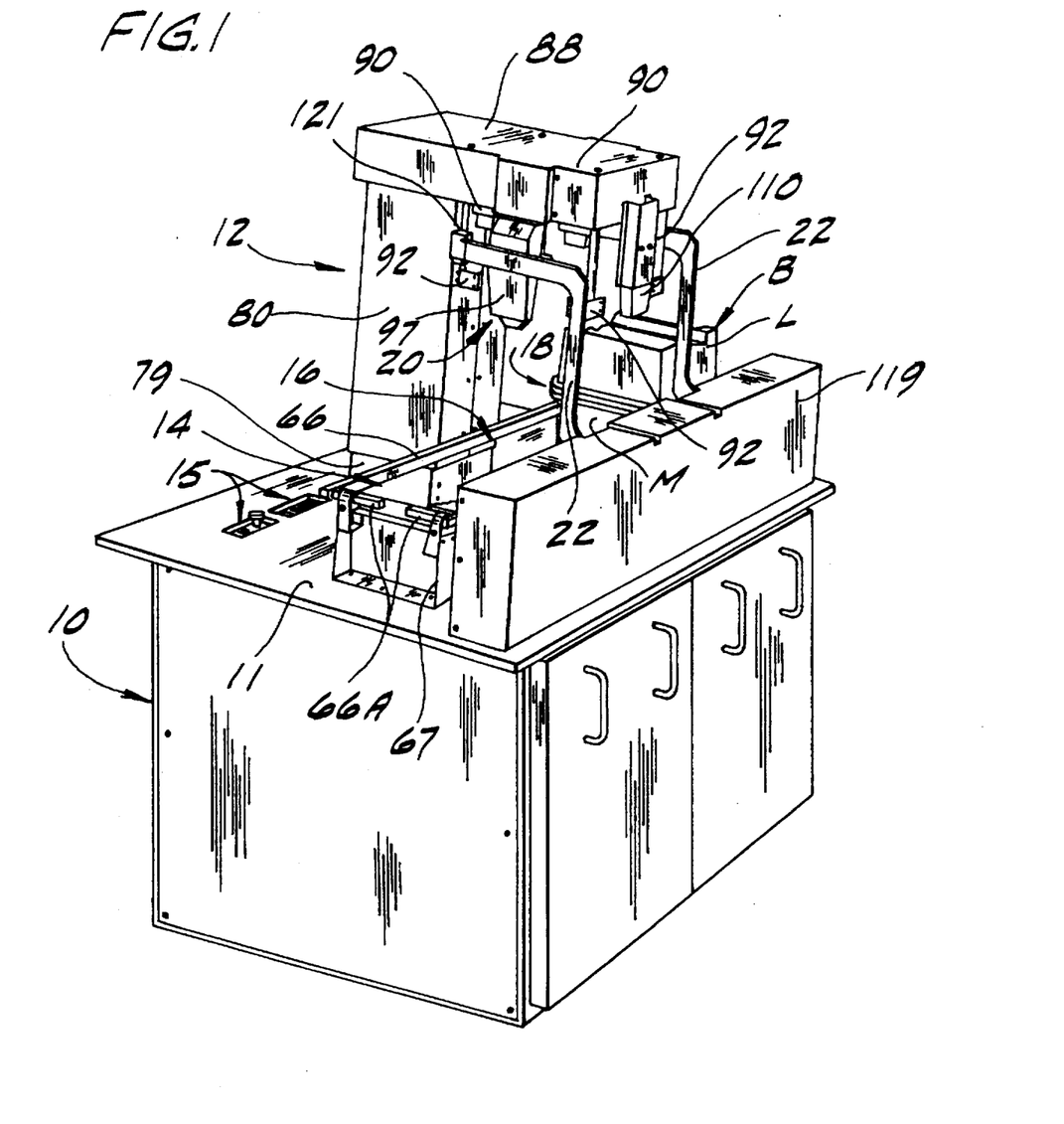
FIG. 1 is a perspective view of box handling apparatus of the present invention.
Figure 2:
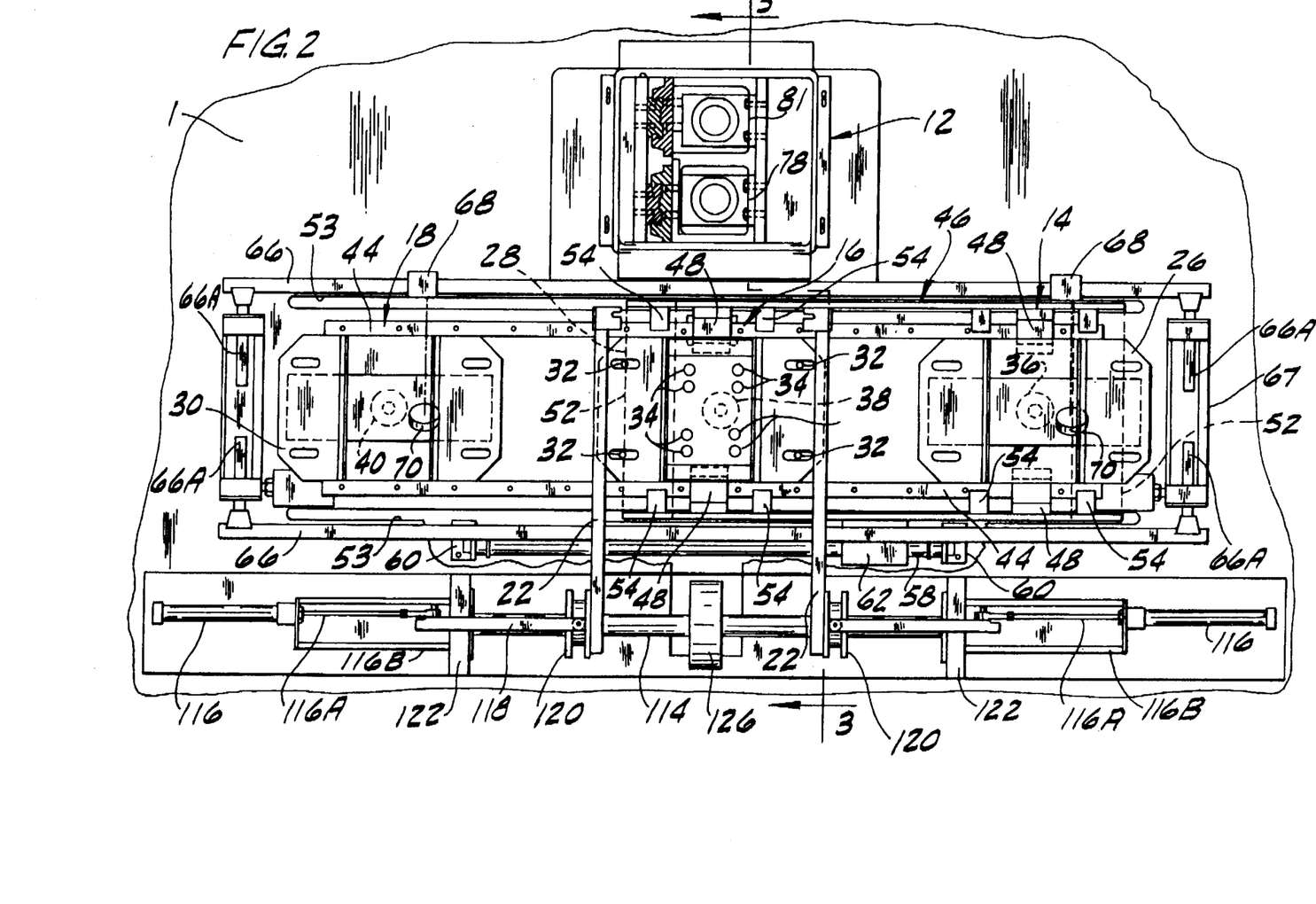
FIG. 2 is a fragmentary top plan view of the apparatus with a box opening assembly, housing and covers removed for clarity, and parts broken away to reveal internal construction of the apparatus.

Referring now to the drawings and in particular to FIGS. 1 and 2, box handling apparatus of the present invention is shown to comprise a base, generally indicated at 10, adapted to rest on the floor and support the other components of the apparatus. The base 10 includes a top 11. An extensible and retractable tower, indicated generally at 12, is mounted on the base 10 and projects upwardly from the base. Controls, generally indicated at 15, are mounted on the top 11 generally at the rear of the apparatus.

A box B, such as a box of the type for holding semiconductor wafers (not shown), may be placed in a entry station indicated generally at 14 at the right end (in the orientation of the apparatus shown in FIG. 1) of the base 10. The apparatus moves the box B to a central load/unload station 16 and thence to an offload station 18 (both number designating their subjects generally) on the left end of the base 10, where the box is removed from the apparatus. In the illustrated embodiment, the box B includes lid L and a bottom M which are constructed for snap-latching interengagement. An example of such a box is the ULTRAPAK box made by Empak, Inc. of Colorado Springs, Colo. A box opening assembly, generally indicated at 20, is supported at the upper end of the tower 12 above the central station 16 for movement with the tower as described more fully hereinafter. A pair of cassette gripping arms 22 (broadly, "article handling members") are mounted for conjoint pivoting motion on the base 10 to remove and replace a wafer cassette C (FIG. 7B) in the box B.

Figure 3:
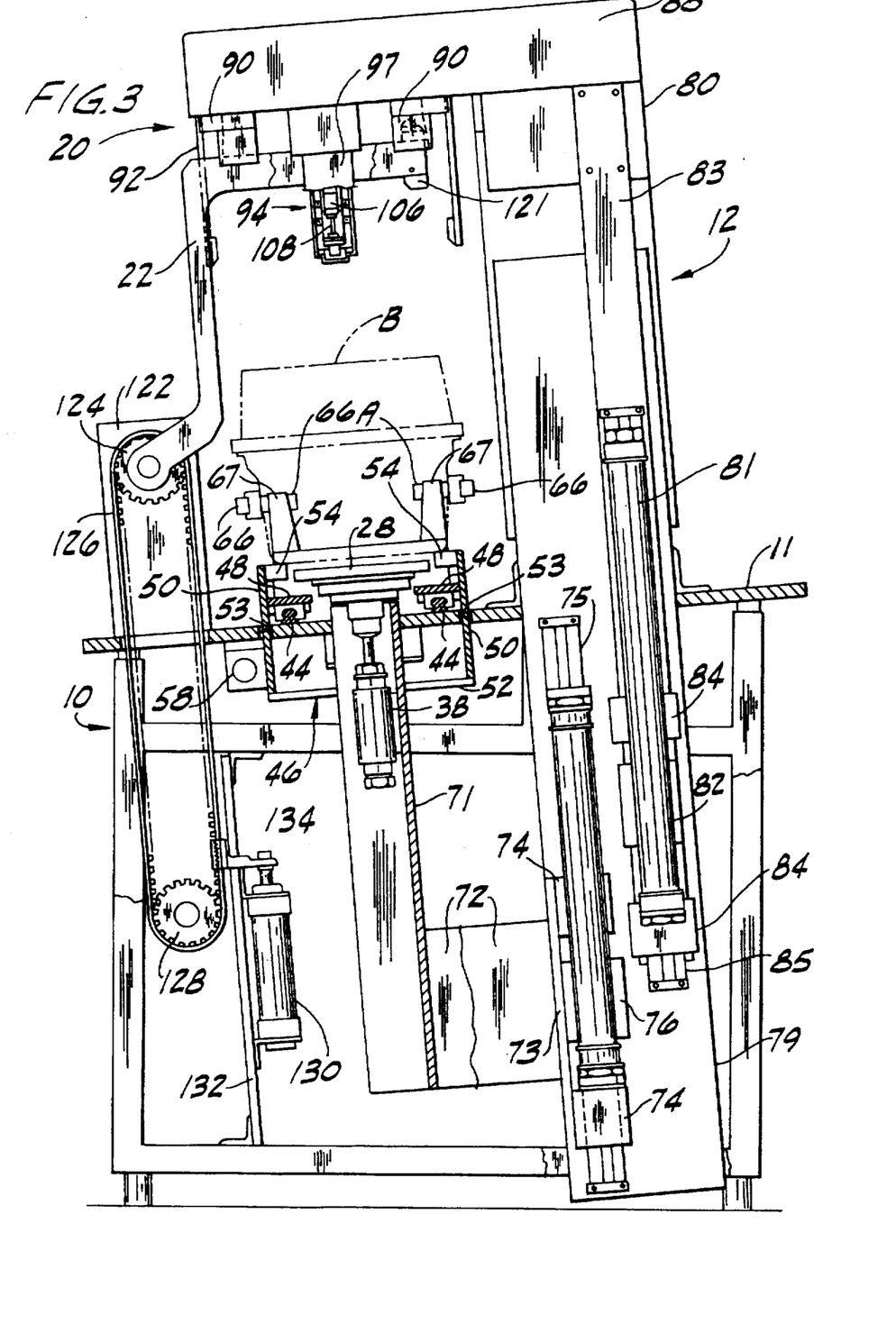
FIG. 3 is a vertical sectional view taken generally along the line 3—3 of FIG. 2, but showing the box opening assembly omitted from FIG. 2.

Referring now to FIGS. 2 and 3, the apparatus is shown to comprise three platforms (broadly, "supports") including an entry platform 26 located at the entry station 14, a center platform 28 located at the central load/unload station 16, and an exit platform 30 located at the offload station 18. The center platform 28 has four locating pins 32 arranged in a rectangle for precisely locating the box B on that platform. The center platform 28 also has eight suction cups 34 arranged for applying vacuum pressure to the bottom M of the box B for holding the bottom of the box down on the center platform. Each platform is mounted on the base 10 by a corresponding pneumatic platform cylinder (designated 36, 38, 40, respectively) so that the platform can be raised and lowered. The platform cylinders 36, 40 associated with the entry and exit platforms 26, 28 are fixedly mounted on the base top 11. The center platform cylinder 38 is differently mounted to allow for additional movement of the center platform 28 necessary to open and close the box B as described hereinafter.

The box B is transported between the stations by a walking beam mechanism which includes a pair of rails 44 extending from the entry station 14 to the exit station 18. A box carriage, generally indicated at 46, includes four trucks 48, each mounted on a respective one of the rails 44 for sliding movement lengthwise of the rail. As shown in FIG. 2, two of the trucks 48 are mounted on each rail 44 laterally opposite the trucks mounted on the other rail. The trucks 48 on each rail 44 are connected together by respective longitudinal connector plates 50, and the longitudinal connector plates are joined to each other by lateral connector plates 52 located at the ends of the carriage 46. The longitudinal connector plates 52 each extend from below the base top 11 through elongate openings 53 to above the top. The lateral connector plates 52 are attached at the bottom of the longitudinal connector plates 50 and are located below the entry platform cylinder 36 and the exit platform cylinder 40. Thus, the trucks 48 and longitudinal connector plates 50 are interconnected to move conjointly along the rails 44 between the ends of the base 10.

The carriage 46 is constructed to support the box B at two locations on the carriage. Two pairs of laterally opposing support tabs 54 are mounted on the longitudinal connector plates 50 at a first of the locations, shown at the exit station 18 in FIG. 2. Another two pairs of laterally opposing support tabs 54 are mounted on the longitudinal connector plates 50 at a second of the locations, shown at the center station in FIG. 2. All of the support tabs 54 project inwardly from the respective longitudinal connector plate 50 to which they are connected and lie substantially in the same plane. The platform cylinders 36, 38, 40 are capable of moving the platforms 26, 28, 30 above the plane of the support tabs 54 to lift a box B off of the support tabs (and hence off of the carriage 46), and capable of moving the platforms below the plane of the tabs to set the box on the support tabs. Thus, it is apparent that the box B moves with the carriage 46 when it rests on the support tabs 54 and does not move with the carriage when supported by any one of the platforms.

The carriage 46 is moved by a rodless carriage cylinder 58 mounted on the apparatus between the position shown in FIG. 2, and a position in which the set of support tabs 54 is located at the central load/unload station 16 and the set of tabs is located at the exit station 18. More specifically, the carriage cylinder 58 is mounted at its ends by brackets 60 to a table top 11 of the base 10. The top 11 has been broken away to show the carriage cylinder 58 in FIG. 2. A slide 62 of the carriage cylinder 58 is connected to the forward longitudinal connector plate 50 of the carriage 46 (FIG. 2). Shock absorbers (not shown) are mounted on the ends of the carriage 46 to achieve a soft stop of the carriage at each end of its travel.

In addition, the box B is held against lateral movement on the carriage 46 and on the platforms 26, 28, 30 by a pair of guides 66 extending from end to end of the base 10 above the platforms and carriage. The guides are mounted at each end by stanchions 67 mounted on the top 11 of the base 10. The guides 66 including lateral members 66A which are slidably connected to the stanchions 67, and permit adjustment of the lateral spacing of the guides. It may be seen in FIG. 3, that the platforms 26, 28, 30 and carriage 46 are mounted at an angle to the horizontal (i.e., tilted downwardly toward the front of the apparatus). The tilt gravitationally biases the semiconductor wafers W in the box B toward one side of the box.

At the entry station 14 and the exit station 18, there is a sensor 68 to detect the presence and orientation of the box B at the station. The sensor 68 is a photoelectric eye mounted on the rear guide 66 and looking forward and downward through an open central portion of the corresponding platform. Light emitted from the eye 68 is reflected by a reflector 70 mounted on the underside of the platform when there is no box at the particular station (14, 16 or 18). However when a box is present in the station in the proper orientation, it blocks the light from the reflector 70 causing a signal from the sensor 68 that a box is present. The vacuum pressure applied through the suction cups 34 is monitored to determine whether the box B is located in the proper orientation in the central station 16.

As shown in FIG. 3, the center platform cylinder 38 is mounted in a channel 71 connected by a pair of joining members 72 to a slide plate 73. A pair of trucks 74 riding on a rail 75 mount the slide plate 73 for generally vertical motion on the apparatus. The slide plate 73 is also connected to a slide 76 of a rodless box lift cylinder 78 mounted in a lower portion 79 of the extensible and retractable tower 12. The lower portion 79 of the tower is fixedly mounted on the base 10 and does not move relative to the base. The box lift cylinder 78 is operable to move the center platform 28 from a lowered position (FIG. 3) to a raised position (FIG. 7B) in which the box B is received in the box opening assembly 20. An upper portion 80 of the tower 12 telescopingly receives the lower portion 79 of the tower for generally vertical sliding motion relative to the lower portion and base 10. A rodless lid lift cylinder 81 is also fixedly mounted on the lower portion 79 of the tower 12. The lid lift cylinder 81 has a slide 82 which is connected to a joining member 83 connecting the slide 82 to the upper portion 80. The joining member 83 is also connected to trucks 84 slidingly mounted on a track 85 to guide the motion of the joining member to move the upper portion between a lowered position (shown in FIG. 3) to a raised position for lifting the lid L off of the bottom M of the box B as described hereinafter.

Figure 4:
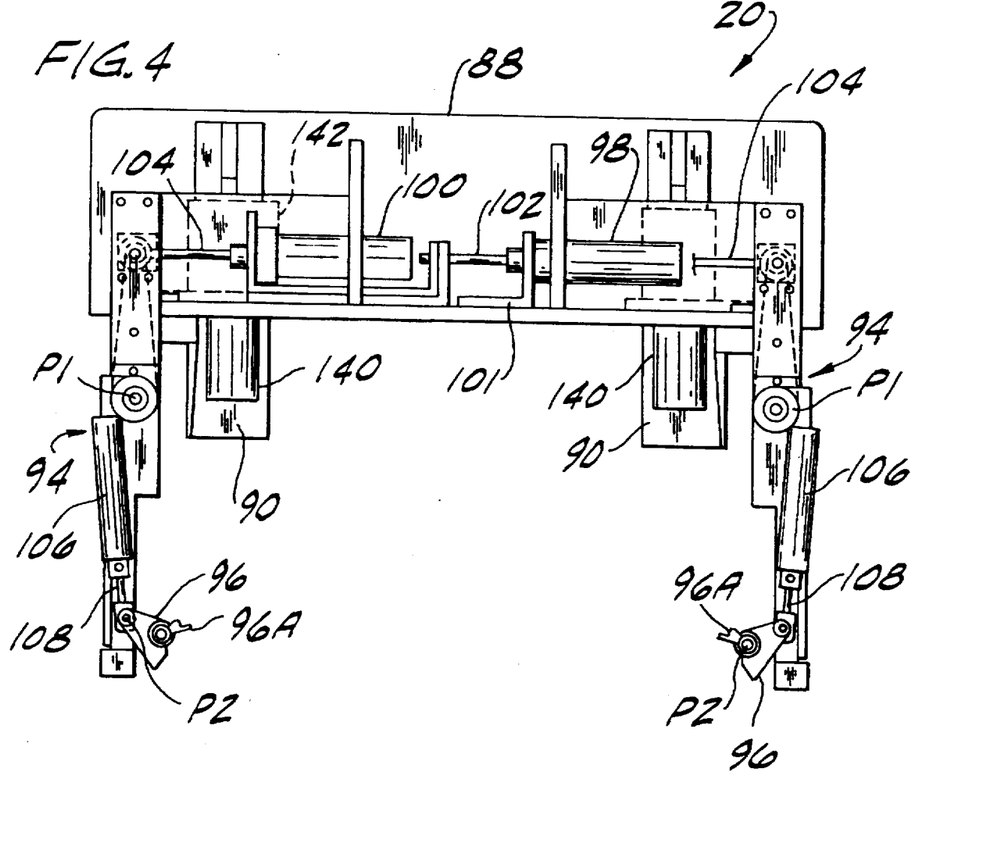
FIG. 4 is a fragmentary sectional view taken as indicated by the line 4—4 of FIG. 5.

The box opening assembly 20 includes a housing 88 mounted on the upper portion 80 of the tower 12 and extending in cantilever fashion forwardly over the center platform 28 of the apparatus. Referring to FIG. 4, the box opening assembly 20 includes four upper lid locators 90 (only two are shown) mounted on the underside of the housing 88 for receiving the top corners of the lid L. Similarly, there are four lower lid locators 92 (FIG. 3, only two are shown) depending from the housing 88 for engaging the lower corners of the lid L. The upper and lower lid locators 90, 92 precisely locate the lid L in the box opening assembly 20. The upper and lower lid locators 90, 92 engage the lid L when the box lift cylinder 78 is activated to raise the center platform 28 and box B.

Figure 5:
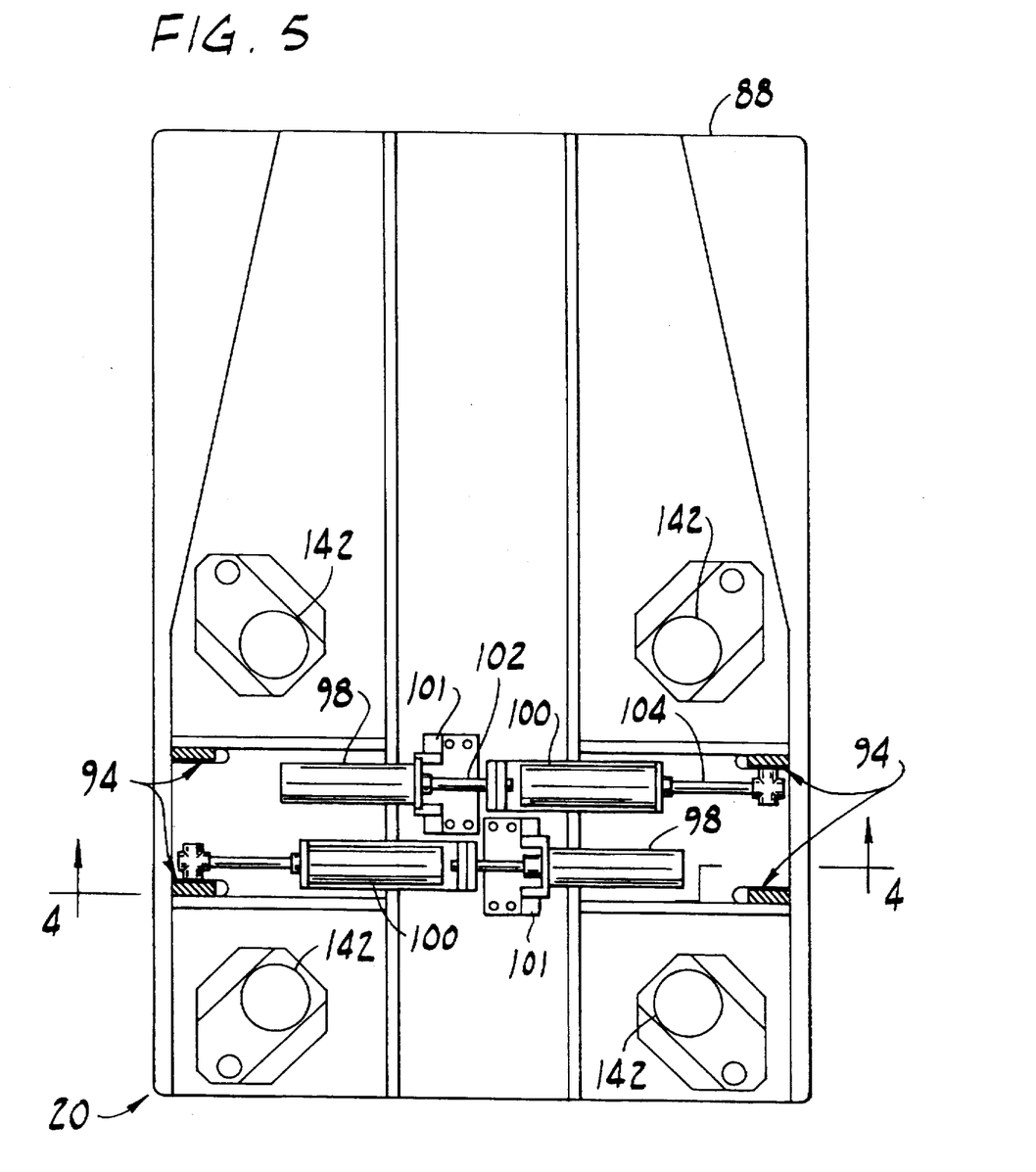
FIG. 5 is a top plan view of the box opening assembly with a top panel of the housing removed to show internal construction.

Referring now to FIGS. 4 and 5, opposing box opening units each include a lid manipulating arm (generally indicated at 94) pivotally mounted on the housing 88 and a finger 96 pivotally mounted on the arm. The arm 94 is covered by a shield 97 (FIG. 1) which is broken away or removed in the other drawings. The finger 96 has a tip 96A at its free end. The arm 94 is actuated by a pair of swing cylinders (designated 98 and 100, respectively) arranged to operate in series in the housing 88 so that each arm has three positions (FIG. 5). A first of the swing cylinders 98 in series is fixedly mounted by a bracket 101 on the housing 88 and has a rod 102 connected to a second of the swing cylinders 100 mounted on the housing for movement lengthwise of the cylinder. The second swing cylinder 100 is slidingly mounted on the housing 88 and includes a rod 104 which is connected to an upper end of the arm 94, above its pivot point P1. Thus, when the first and second swing cylinders 98, 100 have their rods 102, 104 completely retracted, the free end of the arm 94 assumes its most outward position. Extension of the first swing cylinder rod 102 only swings the arm 94 to a middle position. The second swing cylinder 100 is able to slide with respect to the housing to transmit the motion of the rod 102 to the arm 94. Extension of the rods 102, 104 from both swing cylinders 98, 100 moves the free end of the arm to its inwardmost position.

The lid manipulating arms 94 each carry a finger cylinder 106 which moves with the arm. The finger cylinder 106 has a rod 108 which is connected to the finger 96 for swinging the finger through approximately a 90° angle about pivot point P2 for use in unlatching the lid L from the bottom M of the box B, as described hereinafter. After the lid is unlatched from the bottom of the box, the lid lift cylinder 81 extends the upper portion 80 of the tower 12 to raise the lid above the bottom, exposing the wafer cassette C contained in the box B. A purge gas delivery unit 110 is mounted on the forward end of the housing 88 and arranged for directing purge gas into the lid L when it is separated from the box B.

The cassette gripping arms 22 are capable of removing the cassette C from the bottom M of the box B, moving it to a location where the cassette can be loaded or unloaded, and returning the cassette back into the bottom. Referring again to FIG. 2, the gripping arms 22 are each mounted on a splined shaft 114 for conjoint pivoting with the shaft about its longitudinal axis. The gripping arms 22 may slide longitudinally of the shaft 114 for gripping and releasing the cassette C. There is a cassette grip cylinder 116 for each gripping arm 22 which has a rod 116A joined by a yoke 118 to collar 120 connected to the gripping arm for sliding the arm between a release position in which the gripping arms 22 are spaced farther apart and a gripping position in which the arms are spaced more closely and grip the cassette C. The shaft 114 and cylinders 116 are substantially enclosed by a cover 119, which has been removed in FIG. 2. The free end of each gripping arm 22 has a bracket 121 which is specially shaped for engaging and holding the cassette C of the particular type of box being opened.

The splined shaft 114 is journalled in a bearing 122 at each end for rotation about the longitudinal axis of the shaft. The cylinders 116 are connected by respective brackets 116B to the bearing 122. The splined shaft 114 has a gear 124 fixedly mounted on the shaft in its center. As shown in FIG. 3, a toothed belt 126 is received around the gear 124 and extends down to a lower free wheeling gear 128 mounted on the base 10 below gear 124. The rotation of the splined shaft 114 and pivoting of the cassette gripping arms 22 is actuated by a pneumatic gripping arm pivot cylinder 130 mounted on a vertical member 132 of the base 10. A rod 134 of the pivot cylinder 132 is connected to a clamp unit 136 which is connected to the belt 126. Extension of the rod from its position shown in FIG. 3 causes counterclockwise rotation of the splined shaft 114 and pivoting of the gripping arms 22 forwardly away from the box opening assembly 20. From the extended position, retraction of the rod 134 causes clockwise rotation of the shaft 114 and swing the gripping arms 22 back to the position shown in FIG. 3.

Closing of the lid L on the bottom M of the box B is accomplished using the center platform 28, center platform cylinder 38 and four extensible and retractable stops 140 mounted on the housing 88 inside the four lid corner guides 90. When the box B is being opened, the stops are retracted and do not engage the lid L. However to latch the lid L back onto the bottom M, the stops 140 are extended to apply equal pressure to the corners of the lid. The stops 140 each comprise a generally vertically arranged pneumatic stop cylinder 142 which is extensible to lower the stops and retractable to raise the stops. The operation of the apparatus to close the box B will be described in more detail hereinafter.

Having described the construction of the box B handling apparatus, its operation will now be described with reference being made to FIGS. 6–8. For purposes of the present description, operation of the apparatus to load semiconductor wafers into a cassette C will be described. However, it is to be understood that unloading of the wafers can be accomplished with the apparatus of the present invention. The operation is controlled by a programmable logic circuit (not shown), such as a conventional microprocessor of the type used to control process machinery. An empty box B is first placed at the entry station 14 on the entry platform 26 which is raised by the platform cylinder 36 above the carriage 46 for supporting the box off of the carriage. The box will remain supported by the entry platform 26 until such time as the carriage 46 is cycled to return to a position where four of the support tabs 54 are located at the entry station 14. The box lift cylinder 78 is actuated to lower the entry platform 26 so that the box B rests upon the support tabs 54 of the carriage 46. The carriage cylinder 58 is activated to slide the carriage 46 on the rails 44 for bringing the box into the central station 16.

Figure 6A:
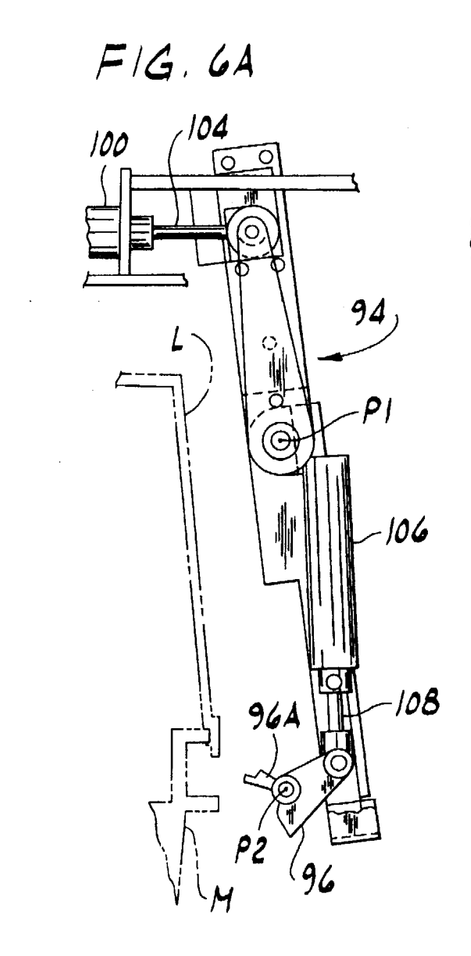
FIGS. 6A–6C are schematic diagrams illustrating the sequence of operation of the apparatus to unlatch and remove a lid from a bottom portion of a box.
Figure 6B:
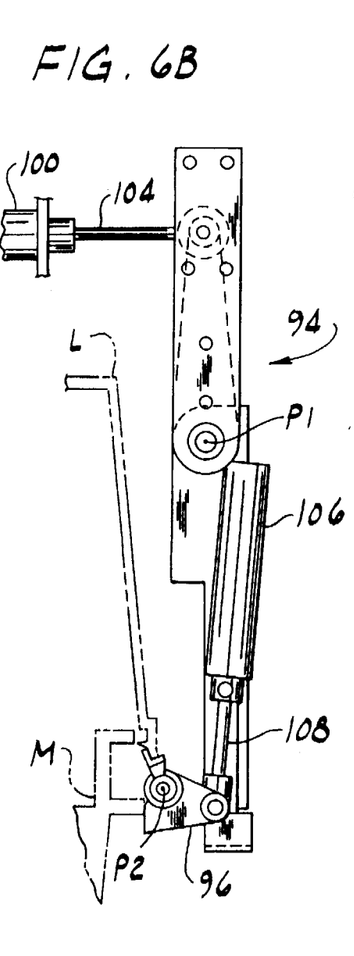
Figure 6C:
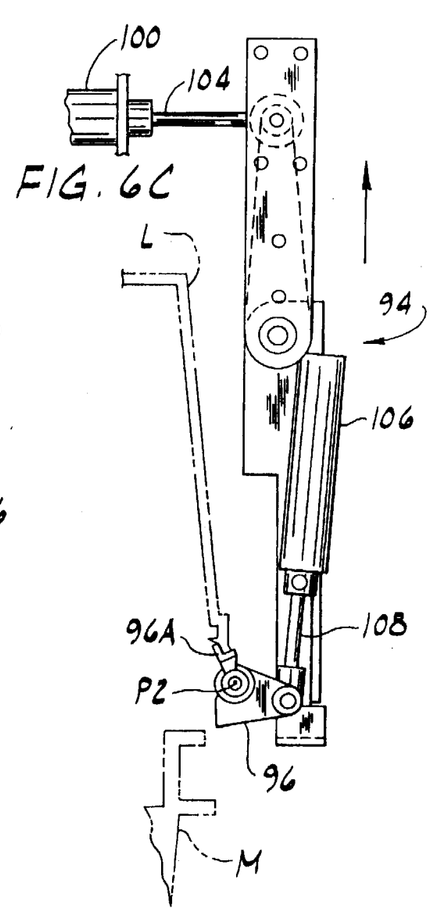

The box lift cylinder 78 moves the center platform 28 up between the support tabs 54 to raise the box B off of the carriage 46 and up into the box opening assembly 20 (FIG. 6A). For clarity, the operation of only one of the arms 9A is illustrated in FIGS. 6A–6C, the operation of the other being identical. At this time, the cassette gripping arms 22 are in their release positions and the lid manipulating arms 94 have been pivoted to their full outward positions so that there are no obstructions for the box as it moves into the box opening assembly 20. The top and bottom corners of the lid L are received in the upper and lower lid locators 90, 92 so that the lid is precisely positioned in the box opening assembly 20. The finger cylinders 106 carried by the lid manipulating arms 94 are extended, causing the fingers 96 to pivot upwardly so that the tips 96A move under the lid L. The fingers 96 continue to pivot so that the tips 96A deflect the lid L outwardly on opposite sides. At the same time the tips 96A engage the lid L the finger 96 below the tip engages the bottom M, deflecting it inwardly. In this way the finger 96 wedges apart the lid L from the bottom M to unlatch the lid from the bottom. The lid lift cylinder 81 is activated to raise the upper portion 80 of the tower 12, carrying the box opening assembly 20 and the lid L held thereby upwardly to separate the lid from the bottom M (FIG. 6C). The vacuum pressure applied by the suction cups 34 to the bottom of the box holds the bottom from being pulled upward by virtue of residual engagement with the lid L. Low pressure purge gas from the purge gas delivery unit 110 floods the lid L so that particulates and moisture are kept off interior surfaces of the lid after it separates from the bottom M.

Figure 7A:
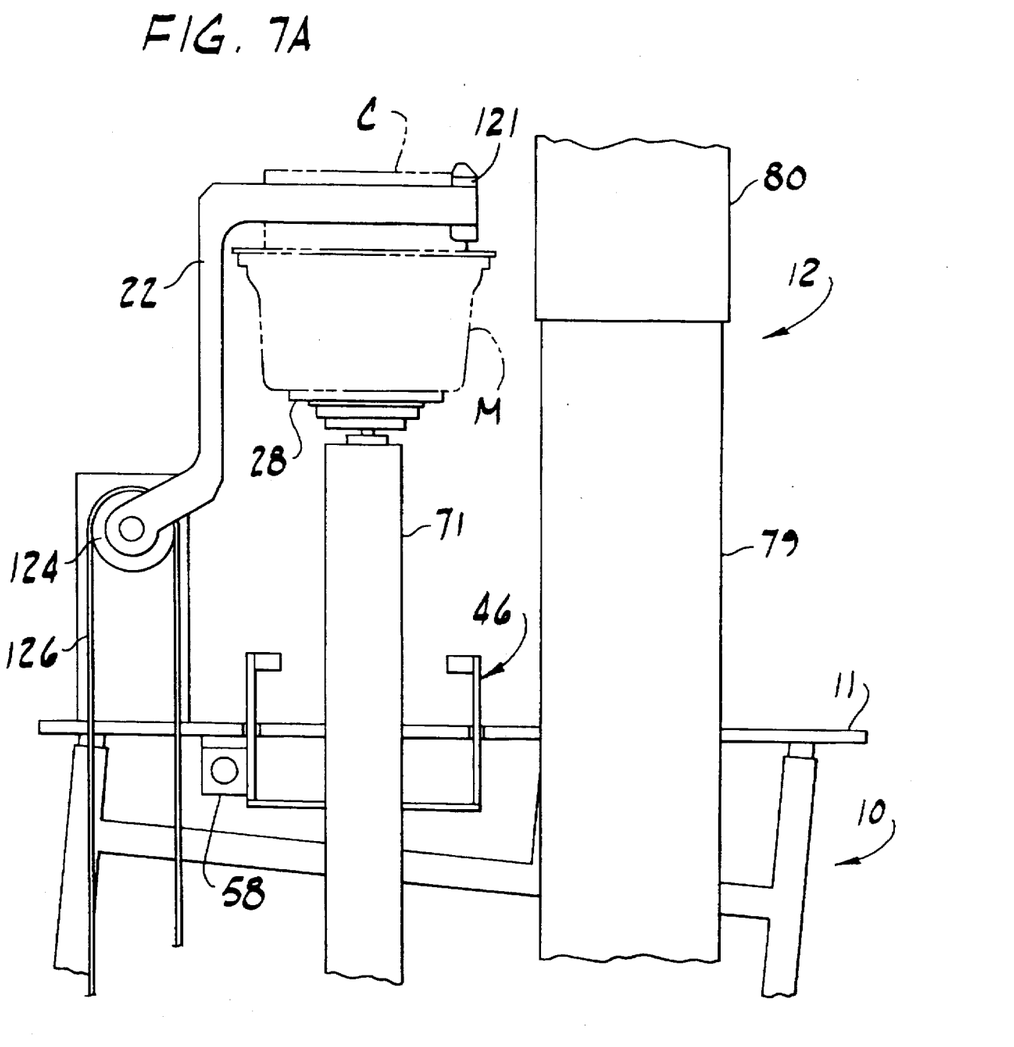
FIGS. 7A–7C are schematic diagrams illustrating the sequence of operation of the apparatus to load and unload a wafer cassette from the box.
Figure 7B:
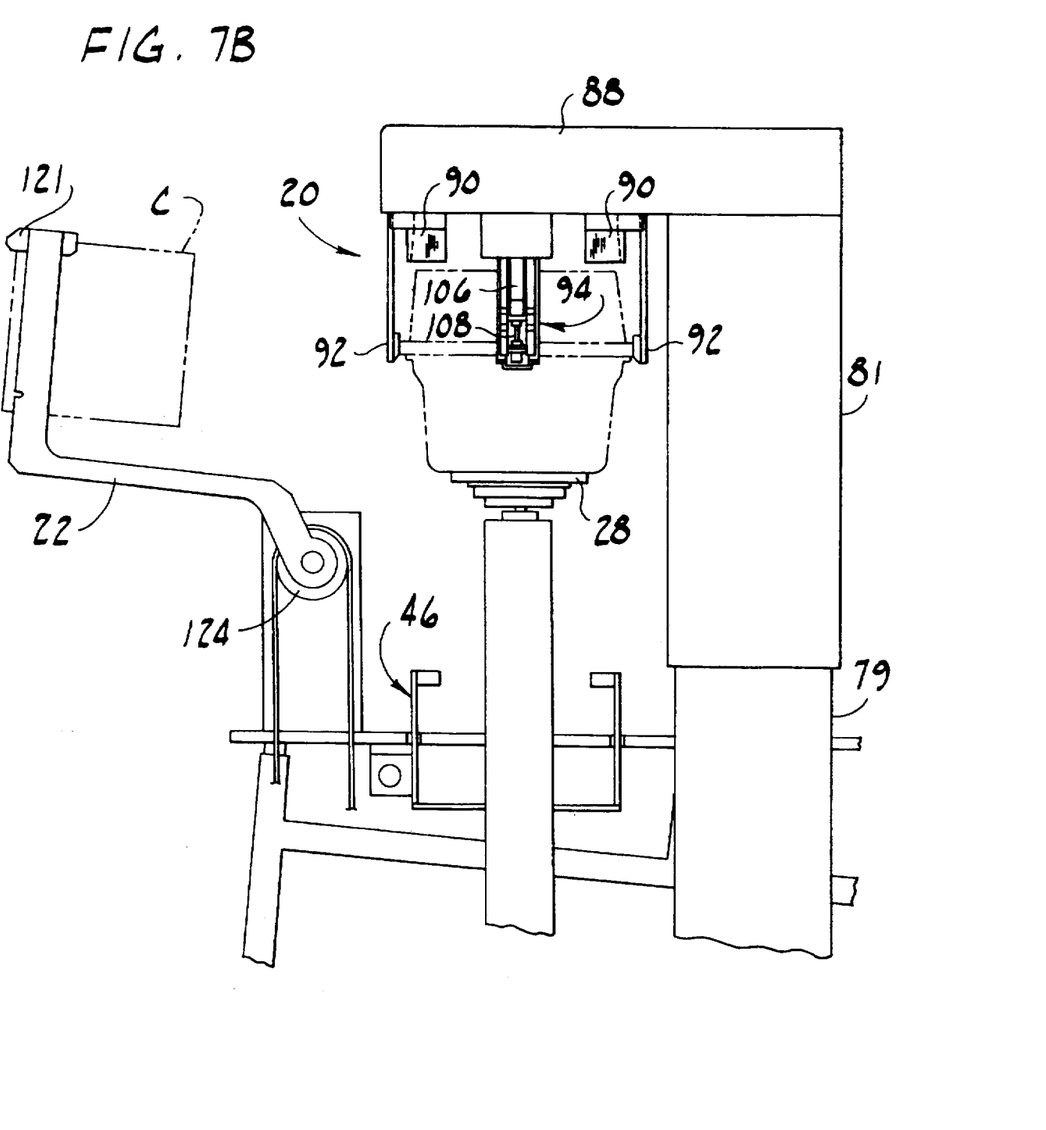
Figure 7C:
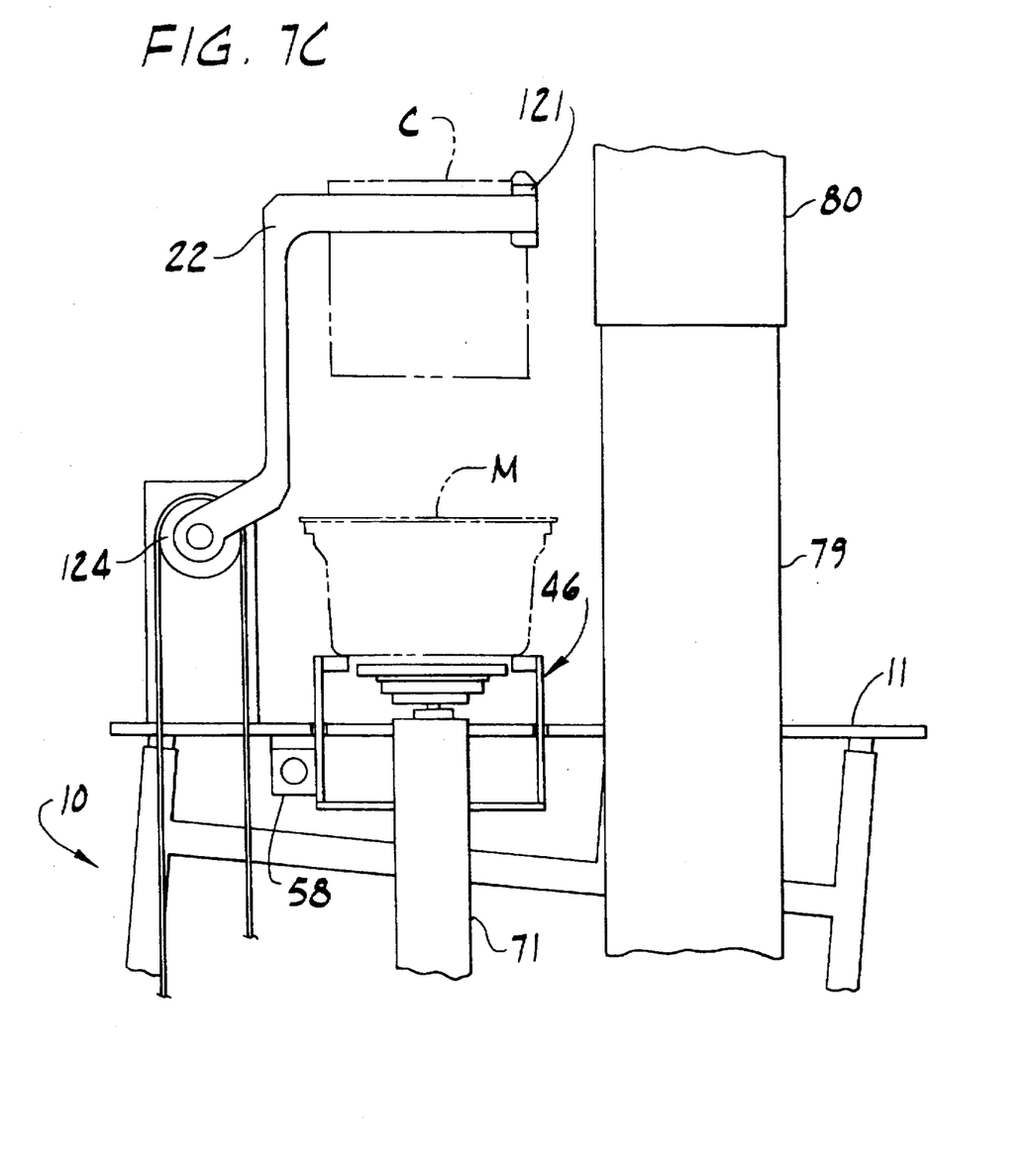
Figure 8A:
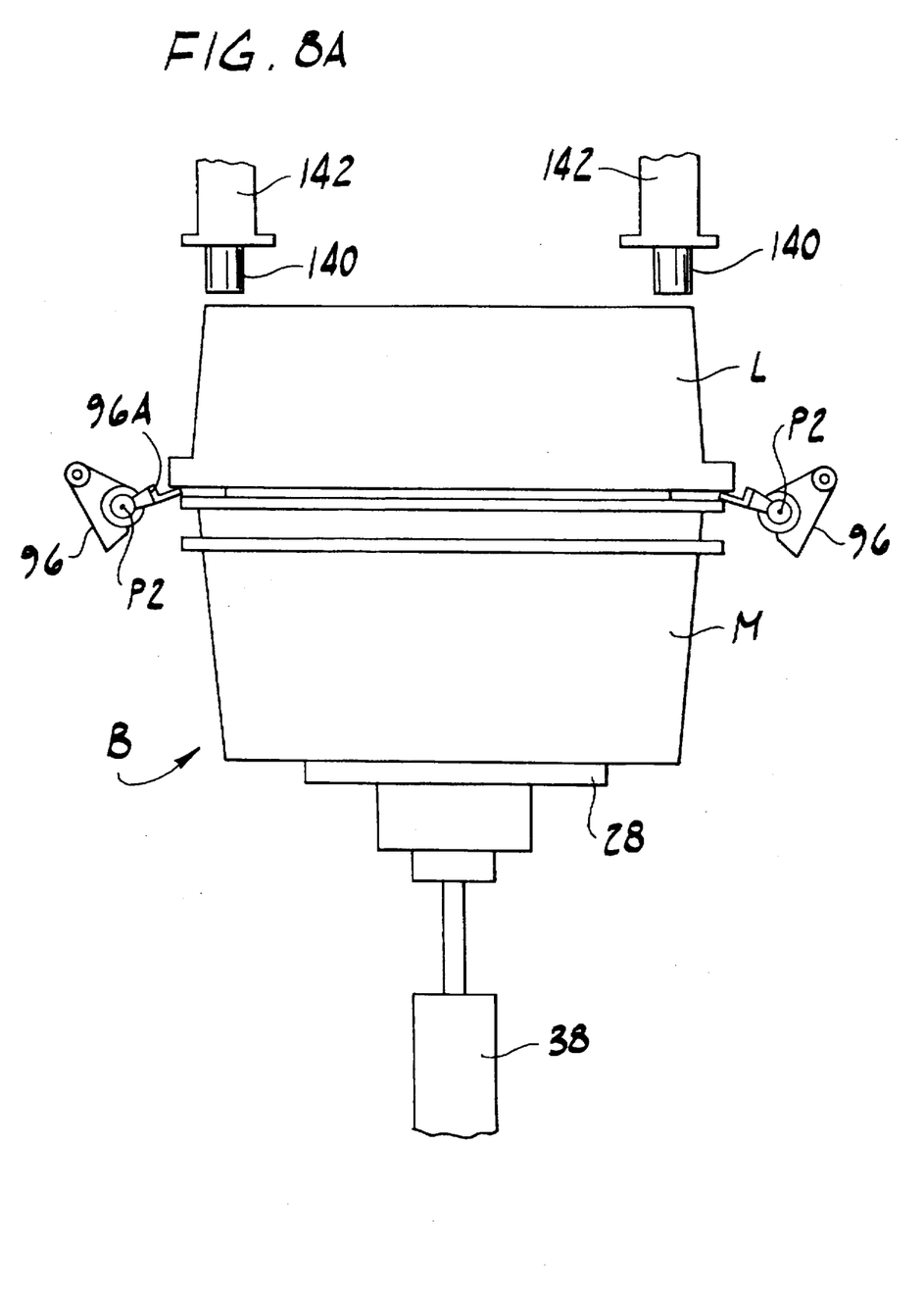
FIGS. 8A–8B are schematic diagrams illustrating the sequence of operation of the apparatus to close the box.
Figure 8B:
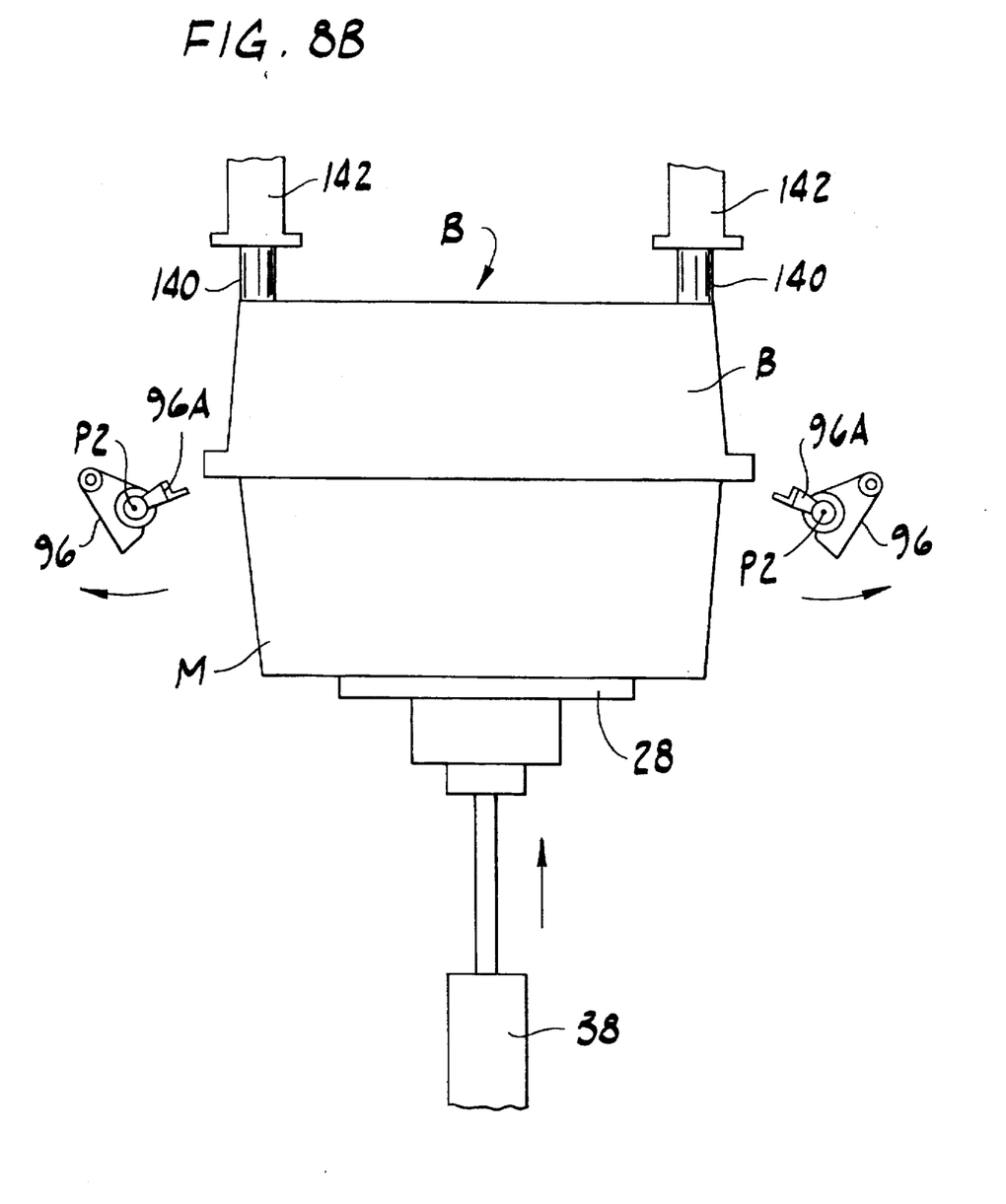

The grip cylinders 116 are activated to concurrently move the cassette gripping arms 22 toward each other to grip the cassette C which projects above the upper edge of the bottom M of the box B (FIG. 7A). The brackets 121 on the ends of the gripping arms 22 have slots which receive protruding portions of the cassette C so that the cassette is held securely by the arms. The box lift cylinder 78 is activated to lower the center platform 28 and the bottom M, so that the cassette C is now supported solely by the gripping arms 22. After the bottom M is lowered and fully clear of the cassette C, the pivot cylinder 130 extends its rod 134 to rotate the splined shaft 114 counterclockwise. The gripping arms 22 and the cassette C held by the arms swing conjointly with the shaft 114 so that the cassette is brought to a load/unload position (FIG. 7B). The cassette C has been moved from an orientation in which it opens upwardly to an orientation where the cassette opens forwardly for receiving semiconductor wafers. When the gripping arms 22 and cassette C are out of the way, the box lift and lid lift cylinders 78, 84 are activated to move the bottom M up and the lid L down to a closed position, as illustrated in FIG. 7B. However, the lid does not latch onto the bottom at this time.

The wafers can be loaded into the cassette C manually, or by commercially available wafer loading apparatus (not shown) in the load/unload position. The wafers are loaded in respective slots (not shown) of the cassette C so that their unfinished (bottom) sides face downwardly and engage the dividers which define the slots. The downward tilt of the platforms 26, 28, 30 and carriage 46 toward the front of the apparatus causes the unfinished sides of the wafers to engage the dividers rather than the finished sides when the cassette C is replaced in the box B.

When the cassette C has been loaded with wafers, a signal indicative of the loaded condition of the cassette is sent to the box handling apparatus. The signal may be manually input or automatically sent by the loading machinery to the apparatus. The box lift and lid lift cylinders 78, 84 are activated to raise the lid L and lower the bottom M, providing space for the cassette C. The pivot cylinder 130 then pivots the gripping arms 22 so that the cassette C is moved back to a position over the center platform 28 (FIG. 7C). The bottom M of the box B is lifted up by the box lift cylinder 78 from the position shown in FIG. 7C so that the cassette C is again supported by the bottom as shown in FIG. 7A. The grip cylinders 116 then retract to move the gripping arms 22 out to their release position, releasing their grip on the cassette C.

The center platform cylinder 38 is retracted so that the bottom M and cassette C are dropped down a short distance (e.g., 1 inch). The lid lift cylinder 81 moves the box opening assembly 20 downward to the bottom M of the box B. However, because the bottom M was dropped down, the lid L is still slightly above the bottom (FIG. 8A). The following actions occur substantially at the same time. The finger cylinders 106 are activated to pivot the fingers 96 downwardly to a position in which the tips 96A are substantially under the lid L and the first arm swing cylinders 98 are also retracted so that the fingers deflect the lid outwardly slightly. As shown in FIG. 8B, the stop cylinders 142 now lock the stops 140 in position for engaging the lid L at the corners. The center platform cylinder 38 moves the bottom M upwardly so that it lifts the lid off of the fingers 96. The lid manipulating arms 94 continue to pivot to their fully outward position out of the way of the box B.

The bottom M and lid L continue upwardly until the lid engages the four stops 140 which hold the lid so that the bottom is now forced to move upwardly within the lid. The bottom is forced into the lid so that the lid may snap-latch onto the bottom. The center platform 28 and the stops 140 help to assure equal pressure distribution over the lid L and bottom M for sealing, latching connection around the entire joint. The lid manipulating arms 94 are also pivoted to their full inward position to push against the sides of the lid L to facilitate latching.

The closed box B is deposited on the support tabs 54 of the carriage 46 by downward movement of the center platform 28 by operation of the box lift cylinder 78. The carriage cylinder 58 is activated to move the box to the offload station 18, and the offload platform 30 is actuated to pick the box off of the carriage 46. The carriage is free to move back to a position for moving a new box into the central load/unload station 16. It will be understood that movement of the carriage 46 to bring the box B to the offload station 18 can simultaneously bring a new box into the central load/unload station 16. As soon as both the loaded box and the new, empty box are lifted off of the carriage 46, the carriage is sent back to its position shown in FIG. 2. It is to be understood that the precise box opening and closing sequences may be other than described without departing from the scope of the present invention.

It is envisioned that by reprogramming and slight mechanical modification of the apparatus lids of different types of semiconductor wafer boxes can be opened and closed. For instance, a CRYSTALPAK box made by Empak, Inc. of Colorado Springs, Colo., requires a different sequence of operation. Once the box (not shown) is brought into the box opening assembly 20, the finger cylinders 106 are extended to pivot the fingers tips 96A to a full up position. The lid manipulating arms 94 are then swung inwardly against the box. The fingers 96 are spring loaded so that the finger tips 96A can snap under the edge of the lid without damaging the box. The arms 94 are then pivoted out to the middle position to unlatch the lid from the box. The box opening assembly 20 is moved upwardly with the lid as before to open the box. To close the box, the box opening assembly is moved downwardly close to the bottom M, which, as above, has been dropped down slightly by the center platform cylinder 38. The bottom is then raised by the center platform cylinder 38 and lifts the lid off of the fingers 96 (and into engagement with the stops). The arms 94 swing to their full outward position.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A box handling apparatus for handling a box having a bottom and a lid, the bottom and lid being capable of releasable, snap-latching interconnection, the apparatus comprising:

a support for holding the box in position for opening the box lid from the bottom of the box;

means for automatically unlatching the lid from the bottom comprising a box opening unit including an arm, a finger pivotally mounted on the arm, and a finger actuator capable of pivoting the finger relative to the arm from a lid release position to a lid opening position so that the finger pivots upwardly under a rim of the box lid;

means for automatically obtaining relative movement between the box and the lid to at least partially separate the lid from the box for providing access to the interior of the box for loading and unloading an article from the box, said moving means being capable of closing separation of the lid and bottom;

means for automatically latching the lid to the bottom of the box thereby to close the box.

2. A box handling apparatus as set forth in claim 1 further comprising an entry station, a box opening and closing station, the support being disposed at the box opening station, an exit station and transport means for automatically transporting the box between the stations.

3. A box handling apparatus as set forth in claim 1 wherein the box opening unit constitutes a first box opening unit and wherein said unlatching means comprises a second box opening unit including an arm, a finger pivotally mounted on the arm, and a finger actuator capable of pivoting the finger relative to the arm from a lid release position to a lid opening position so that the finger pivots upwardly under a rim of the box lid, the arm and finger of the second box opening unit being generally opposite the arm and finger of the first box opening assembly.

4. A box handling apparatus as set forth in claim 3 further comprising means for purging the interior of the box when the lid is separated from the bottom.

5. A box handling apparatus as set forth in claim 3 wherein said latching means comprises an extensible and retractable stop disposed in an extended position of the stop for bearing against the lid, and an actuator connected to the support for moving the bottom of the box upwardly whereby the lid and box portion can be forced together between the support and the stop into latching interengagement.

6. A box handling apparatus as set forth in claim 3 wherein said means for obtaining relative movement comprises an actuator connected to the first and second box opening units and capable of raising and lowering the first and second box opening units.

7. A box handling apparatus as set forth in claim 1 further comprising means for automatically loading and unloading the box. first distance and the members grip an article disposed within the box.

8. A box handling apparatus set forth in claim 7 wherein said loading and unloading means for handling a box having a bottom and a lid, the bottom and lid being capable of releasable, snap-latchinq interconnection, the apparatus comprising:

a support for holding the box in position for opening the box lid from the bottom of the box;

means for automatically unlatching the lid from the bottom;

means for automatically obtaining relative movement between the box and the lid to at least partially separate the lid from the box for providing access to the interior of the box for loading and unloading an article from the box, said moving means being capable of closing separation of the lid and bottom;

means for automatically latching the lid to the bottom of the box thereby to close the box;

means for automatically loading and unloading the box comprising first and second opposed article handling members movably mounted on the apparatus for movement between an open position in which the members are spaced apart a first distance, and a grip position in which the members are spaced apart a second distance less than the first distance and the members grip an article disposed within the box.

9. A box handling apparatus as set forth in claim 8 wherein the article handling members are pivotally mounted on the apparatus for swinging between a first position in which the members are disposed generally adjacent to the box support and a second position in which the members are located away from the support.

10. A box handling apparatus for handling a box having a bottom and lid being capable of releasable, snap-latchinq interconnection, the apparatus comprising:

a support for holding the box in position for opening the box lid from the bottom of the box, the support being mounted on the apparatus at an angle from the horizontal for urging contents of the box in a selected direction;

means for automatically unlatching the lid from the bottom;

means for automatically obtaining relative movement between the box and the lid to at least partially separate the lid from the box for providing access to the interior of the box for loading and unloading an article from the box, said moving means being capable of closing separation of the lid and bottom;

means for automatically latching the lid to the bottom of the box thereby to close the box.

11. A method of handling a box in an apparatus for loading and unloading an article from the box, the box having a lid and a bottom constructed for snap-latching interengagement, the method comprising:

placing the box on a support of the apparatus with the lid latchingly interengaged with the bottom of the box;

moving the box into a box opening assembly;

activating the box opening assembly to unlatch the lid from the bottom of the box;

obtaining relative motion between the box opening assembly and the bottom of the box to separate the lid at least partially from the bottom;

activating article handling members to engage the article;

activating the article handling members to move the engaged article from one of a location inside the bottom of the box and a location outside of the box to the other of the locations.

12. A method as set forth in claim 11 further comprising the step of purging at least one of the lid and the bottom when the lid is separated from the bottom.

13. A method as set forth in claim 11 wherein the step of activating the article handling members to move the engaged article comprises activating the article handling members to move the engaged article into the bottom of the box, and wherein the method further comprises the steps of obtaining relative motion between the box opening assembly and the bottom of the box to close the separation of the lid from the bottom and pressing by relative motion of the support and box closing assembly the lid down on the box to latch the lid on the box.

* * * * *

UNITED STATES PATENT AND TRADEMARK OFFICE
CERTIFICATE OF CORRECTION

PATENT NO. : 5,894,711

DATED : April 20, 1999

INVENTOR(S) : James P. Davidson, Andrew Paul Lunday, Gordon P. Hampton, James C. Lenk, Gary L. Anderson, Larry W. Shive It is certified that error appears in the above-identified patent and that said Letters Patent is hereby corrected as shown below:

In Column 10, Claim 7, line 15, "the box. first distance and the members grip an article disposed within the box." should read -- the box. --

In Column 10, Claim 8, lines 16-17, "apparatus set forth in claim 7 wherein said loading and unloading means for" should read -- apparatus for --.

In Column 10, Claim 8, line 19, "snap-latchinq" should read -- snap-latching --.

In Column 10, Claim 10, line 49, "snap-latchinq" should read -- snap-latching --.

Signed and Sealed this

Twentieth Day of June, 2000

Attest:

Q. TODD DICKINSON

*Attesting Officer*     *Director of Patents and Trademarks*